US012789312B2

(12) United States Patent
Kang et al.

(10) Patent No.: US 12,789,312 B2
(45) Date of Patent: Nov. 10, 2026

(54) MANUFACTURING APPARATUS AND METHOD OF MANUFACTURING DISPLAY APPARATUS USING THE SAME

(71) Applicant: Samsung Display Co., LTD., Yongin-si (KR)

(72) Inventors: Seungbae Kang, Yongin-si (KR); Heesung Yang, Yongin-si (KR); Youngho Jeong, Yongin-si (KR); Hyun Ju, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 63 days.

(21) Appl. No.: 18/656,780

(22) Filed: May 7, 2024

(65) Prior Publication Data

US 2024/0292725 A1 Aug. 29, 2024

Related U.S. Application Data

(62) Division of application No. 16/792,948, filed on Feb. 18, 2020, now Pat. No. 12,010,902.

(30) Foreign Application Priority Data

May 8, 2019 (KR) ........................ 10-2019-0053908

(51) Int. Cl.
*B24B 37/07* (2012.01)
*B08B 5/04* (2006.01)
(Continued)

(52) U.S. Cl.
CPC .............. *B24B 37/04* (2013.01); *B08B 5/043* (2013.01); *B08B 7/0028* (2013.01); *B24B 7/245* (2013.01); *B24B 57/02* (2013.01); *H10K 59/12* (2023.02)

(58) Field of Classification Search
CPC ......... B24B 37/04; B24B 7/245; B24B 57/02; B24B 27/0069; B24B 41/005;
(Continued)

(56) References Cited

U.S. PATENT DOCUMENTS 5,989,105 A 11/1999 Kawaguchi et al.
6,200,201 B1 3/2001 Ravkin et al.
(Continued)

FOREIGN PATENT DOCUMENTS

CN 208697130 U 4/2019
DE 19732433 A1 2/1998
(Continued)

OTHER PUBLICATIONS

Office Action mailed Nov. 23, 2023 in corresponding CN Application No. 202010377709.9, 10 pages.

*Primary Examiner* — Bac H Au
(74) *Attorney, Agent, or Firm* — CANTOR COLBURN LLP

(57) ABSTRACT

An apparatus for manufacturing a display apparatus includes: a polisher at which a polishing material is supplied to a base member of the display apparatus and the base member is polished with the polishing material to provide a polished base member having a polished surface; a conveyer to which the polished base member is provided from the polisher and from which the polished base member is transferred to outside the apparatus; and a suction unit corresponding to the conveyer and by which a pressure around the conveyer is provided to be lower than a pressure at remaining portions of the apparatus.

10 Claims, 9 Drawing Sheets

(51) Int. Cl.

| | |
|---|---|
| ***B08B 7/00*** | (2006.01) |
| ***B24B 7/24*** | (2006.01) |
| ***B24B 37/04*** | (2012.01) |
| ***B24B 57/02*** | (2006.01) |
| *H10K 59/12* | (2023.01) |

(58) Field of Classification Search

CPC ....... B24B 55/06; B24B 55/12; G02F 1/1303; B08B 15/002; B65G 15/00; B65G 37/00

See application file for complete search history.

(56) References Cited

U.S. PATENT DOCUMENTS

| | | | |
|---|---|---|---|
| 6,379,230 | B1 | 4/2002 | Hayashi et al. |
| 6,997,782 | B2 | 2/2006 | Nishi et al. |
| 7,115,022 | B2 | 10/2006 | Watanabe et al. |
| 9,409,214 | B2 | 8/2016 | Jang et al. |
| 2001/0036792 | A1 | 11/2001 | Ferri et al. |
| 2005/0123280 | A1 | 6/2005 | Taira et al. |
| 2005/0130386 | A1 | 6/2005 | Watanabe et al. |
| 2007/0141312 | A1 | 6/2007 | James |
| 2009/0011572 | A1 | 1/2009 | Kaneko |
| 2009/0264049 | A1* | 10/2009 | Chen ....................... B24B 55/12 451/28 |
| 2010/0276078 | A1 | 11/2010 | Kitada et al. |
| 2015/0314418 | A1* | 11/2015 | Shinozaki ............... B24B 55/12 156/345.12 |
| 2016/0059380 | A1 | 3/2016 | Yamaguchi et al. |
| 2016/0096208 | A1 | 4/2016 | Jang et al. |
| 2016/0240415 | A1 | 8/2016 | Sekiya |
| 2018/0056479 | A1 | 3/2018 | Hu et al. |
| 2020/0180103 | A1 | 6/2020 | Ye et al. |
| 2020/0331251 | A1 | 10/2020 | Lee et al. |
| 2022/0219284 | A1 | 7/2022 | Nam et al. |

FOREIGN PATENT DOCUMENTS

| | | | |
|---|---|---|---|
| JP | H07263388 | A | 10/1995 |
| JP | H1050641 | A | 2/1998 |
| JP | 2000313625 | A | 11/2000 |
| JP | 4405965 | B2 | 11/2009 |
| KR | 1019980012050 | U | 5/1998 |
| KR | 1020050023439 | A | 3/2005 |
| KR | 1020070067641 | A | 6/2007 |
| KR | 20100067945 | A | 6/2010 |
| KR | 1020110035580 | A | 4/2011 |
| KR | 1020150000742 | A | 1/2015 |
| KR | 20160040374 | A | 4/2016 |
| KR | 1020160040374 | A | 4/2016 |
| KR | 101932431 | B1 | 12/2018 |
| WO | 2004068569 | A1 | 8/2004 |

* cited by examiner

MANUFACTURING APPARATUS AND METHOD OF MANUFACTURING DISPLAY APPARATUS USING THE SAME

This application is a divisional of U.S. patent application Ser. No. 16/792,948, filed on Feb. 18, 2020, which claims priority to Korean Patent Application No. 10-2019-0053908, filed on May 8, 2019, and all the benefits accruing therefrom under 35 U.S.C. § 119, the disclosure of which is incorporated herein in its entirety by reference.

BACKGROUND

1. Field

One or more embodiments relate to a manufacturing apparatus and method using the same. More particularly, one or more embodiments relates to a manufacturing apparatus and method of manufacturing a display apparatus using the same.

2. Description of the Related Art

Mobile electronic devices are widely used. Tablet personal computers ("PCs") as well as relatively small electronic devices such as mobile phones are widely used as mobile electronic devices.

Mobile electronic devices include display apparatuses for providing visual information such as images to users such as in supporting various functions of the mobile electronic devices. As components for driving display apparatuses have been miniaturized, use of display apparatuses in mobile electronic devices have gradually increased and structures of the display apparatuses have been developed to be bendable by predetermined angles from flat states of the display apparatuses.

SUMMARY

One or more embodiments of the present disclosure include an apparatus and method of manufacturing a display apparatus using the same which reduces or effectively prevents stains on a substrate of the display apparatus when a polishing material is dried after polishing of the substrate in a polishing process during the manufacture of the display apparatus.

Additional features will be set forth in part in the description which follows and, in part, will be apparent from the description, or may be learned by practice of the presented embodiments.

According to one or more embodiments, an apparatus for manufacturing a display apparatus includes: a polisher at which a polishing material is supplied to a base member of the display apparatus and the base member is polished with the polishing material to provide a polished base member having a polished surface; a conveyer to which the polished base member is provided from the polisher and from which the polished base member is transferred to outside the apparatus; and a suction unit corresponding to the conveyer and by which a pressure around the conveyer is provided to be lower than a pressure at remaining portions of the apparatus.

The apparatus may further include a feeder with which the base member is transferred to the polisher. At least one of the feeder and the conveyer may include a roller with which the base member is movable along the apparatus.

The polishing material may include a liquid.

The polished base member provided to the conveyer may include a portion of the polishing material which remains on the polished surface of the polished base member to define a remaining polishing material, and operation of the suction unit maintains the liquid in the remaining polishing material on the polished surface of the polished base member at a level equal to or greater than about 90% of a total weight of the remaining polishing material on the polished base member.

The apparatus may further include a polishing head corresponding to the polisher and with which the base member is polished at the polisher to provide the polished base member having the polished surface. The polisher may include a belt with which the base member is movable along the apparatus to be disposed corresponding to the polishing head.

The suction unit may include: a suction pipe spaced apart from the conveyer and into which a gas at the conveyer is drawn, the suction pipe including an inlet portion through which the gas at the conveyer is drawn into to the suction pipe; and a guide pipe connected to the suction pipe.

A cross-sectional area of the inlet portion of the suction pipe may be greater than a cross-sectional area of the guide pipe.

The inlet portion of the suction pipe may correspond to the conveyer and a portion of the polisher.

A wall of the suction pipe at the inlet portion thereof may be inclined.

According to one or more embodiments, a method of manufacturing a display apparatus includes: providing a polishing material on a base member of the display apparatus which is unpolished, a pressure at the surface of the base member which is unpolished defining an atmospheric pressure; polishing a surface of the base member which is unpolished with the polishing material to provide a polished base member having the polishing material on a polished surface; and providing a pressure at the polished surface of the polished base member which is different from the atmospheric pressure.

The polishing the surface of the base member may include transferring the base member to a polisher of a manufacturing apparatus and transferring the polished base member from the polisher to outside the manufacturing apparatus by using a roller.

The providing the polishing material on the base member may include providing the base member on a belt of a manufacturing apparatus with which the base member is movable along the manufacturing apparatus.

The pressure at the polished surface of the polished base member may be lower than the atmospheric pressure defined at the surface of the base member which is unpolished.

The providing the pressure may include providing a suction pipe of a manufacturing apparatus facing the polished surface of the polished base member having the polishing material thereon and drawing a gas from around the polished base member into the suction pipe to provide the pressure at the polished surface which is different from the atmospheric pressure.

The suction pipe may include an inlet portion through which the gas from around the polished base member is drawn into to the suction pipe, and a wall of the suction pipe at the inlet portion may be inclined.

A cross-sectional area of the inlet portion of the suction pipe may be greater than a total planar area of the base member.

The polishing the surface of the base member may be performed at a polisher of a manufacturing apparatus which precedes the suction pipe along the manufacturing apparatus, and the method man further include transferring the polished base member to an area outside the manufacturing apparatus which follows the suction pipe and includes the atmospheric pressure.

The polishing material may include a liquid, and the suction pipe drawing the gas from around the polished base member into the suction pipe to provide the pressure at the polished surface which is different from the atmospheric pressure, may maintain the liquid in the polishing material on the polished surface at a level equal to or greater than about 90% of a total weight of the polishing material on the polished surface.

The polishing material may include deionized water, a surfactant, and slurry.

According to one or more embodiments, a method of manufacturing a display apparatus includes: at a polisher of a manufacturing apparatus, supplying a polishing material to a base member of the display apparatus and polishing the base member by using the polishing material, the polishing the base member providing a polished base member having the polishing material thereon; transferring the polished base member from the polisher to a conveyer of the manufacturing apparatus which follows the polisher along the manufacturing apparatus; and drawing a gas from around the polished base member which is at the polisher and the conveyer, into a suction pipe of the manufacturing apparatus which faces each of the polisher and the conveyer, to maintain the polishing material on the polished base member which is at the polisher and the conveyer.

Other features and advantages of the present disclosure will become more apparent from the drawings, the claims, and the detailed description.

These general and specific embodiments may be implemented by using a system, a method, a computer program, or a combination thereof.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
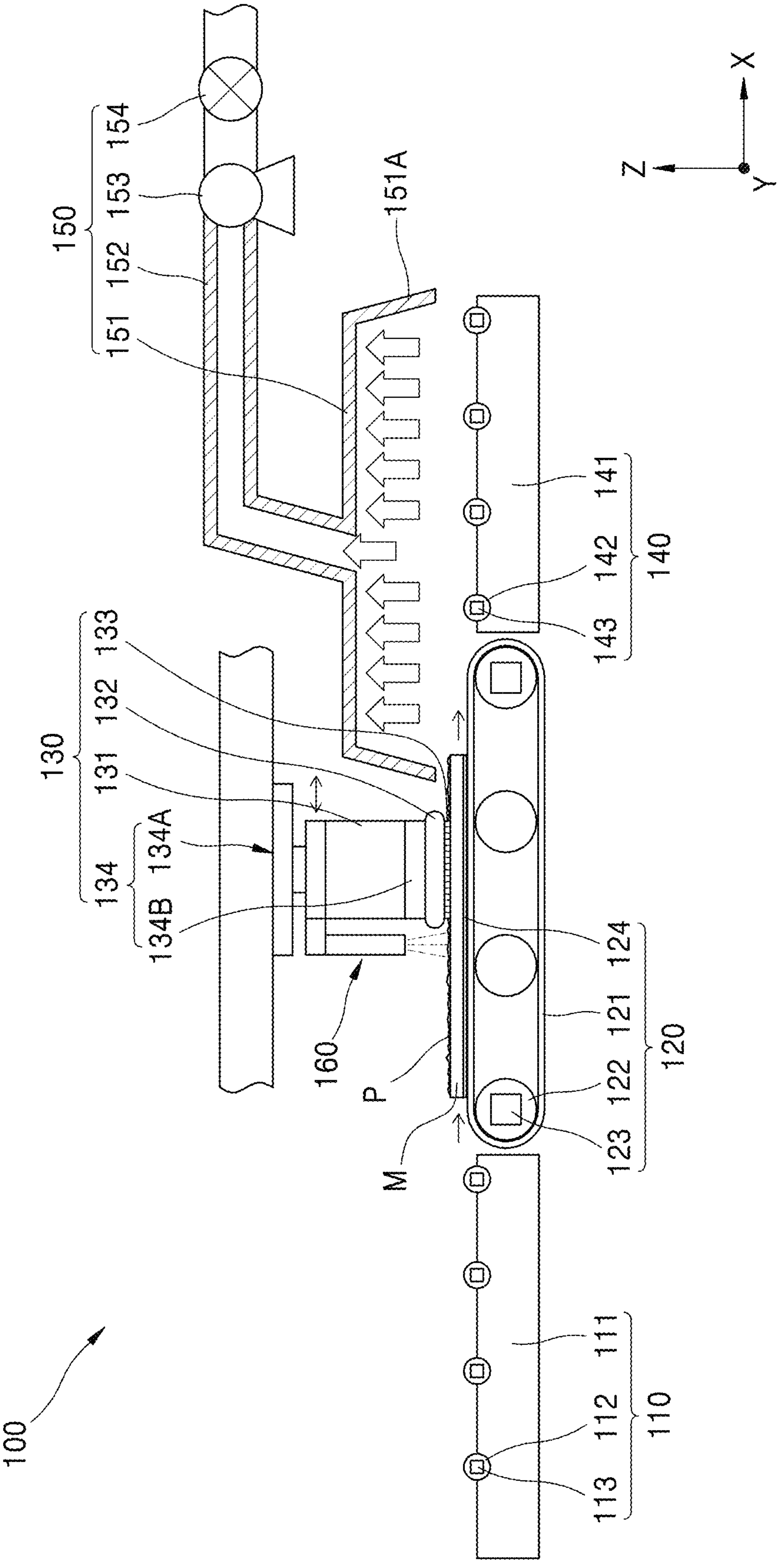
FIG. 1 is a cross-sectional view illustrating an embodiment of an apparatus for manufacturing a display apparatus.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain features of the present description.

It will be understood that although the terms "first", "second", etc. may be used herein to describe various elements, these elements should not be limited by these terms and these terms are only used to distinguish one element from another.

The terminology used herein is for the purpose of describing particular embodiments only and is not intended to be limiting. As used herein, the singular forms "a", "an", and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

It will be further understood that the terms "comprises" and/or "comprising" used herein specify the presence of stated features or components, but do not preclude the presence or addition of one or more other features or components.

It will be understood that when a layer, region, or element is referred to as being related to another such as being "on" another layer, region, or element, it may be directly or indirectly on the other layer, region, or element, or intervening layers, regions, or elements may be present therebetween. In contrast, when a layer, region, or element is referred to as being related to another such as being "directly on" another layer, region, or element, no intervening layers, regions, or elements are present therebetween Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, sizes of elements may be exaggerated for convenience of explanation. For example, because sizes and thicknesses of elements in the drawings are arbitrarily illustrated for convenience of explanation, the present disclosure is not limited thereto.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be different from the described order. For example, two consecutively described processes may be performed substantially at the same time or performed in an order opposite to the described order.

Defects may occur in a display apparatus when a foreign material is adhered to a substrate used in the display apparatus. Structures and method of manufacturing related to the display apparatus have been researched, in which the foreign material is removed during the manufacture of the display apparatus to reduce or effectively prevent defects in the display apparatus.

Figure 2:
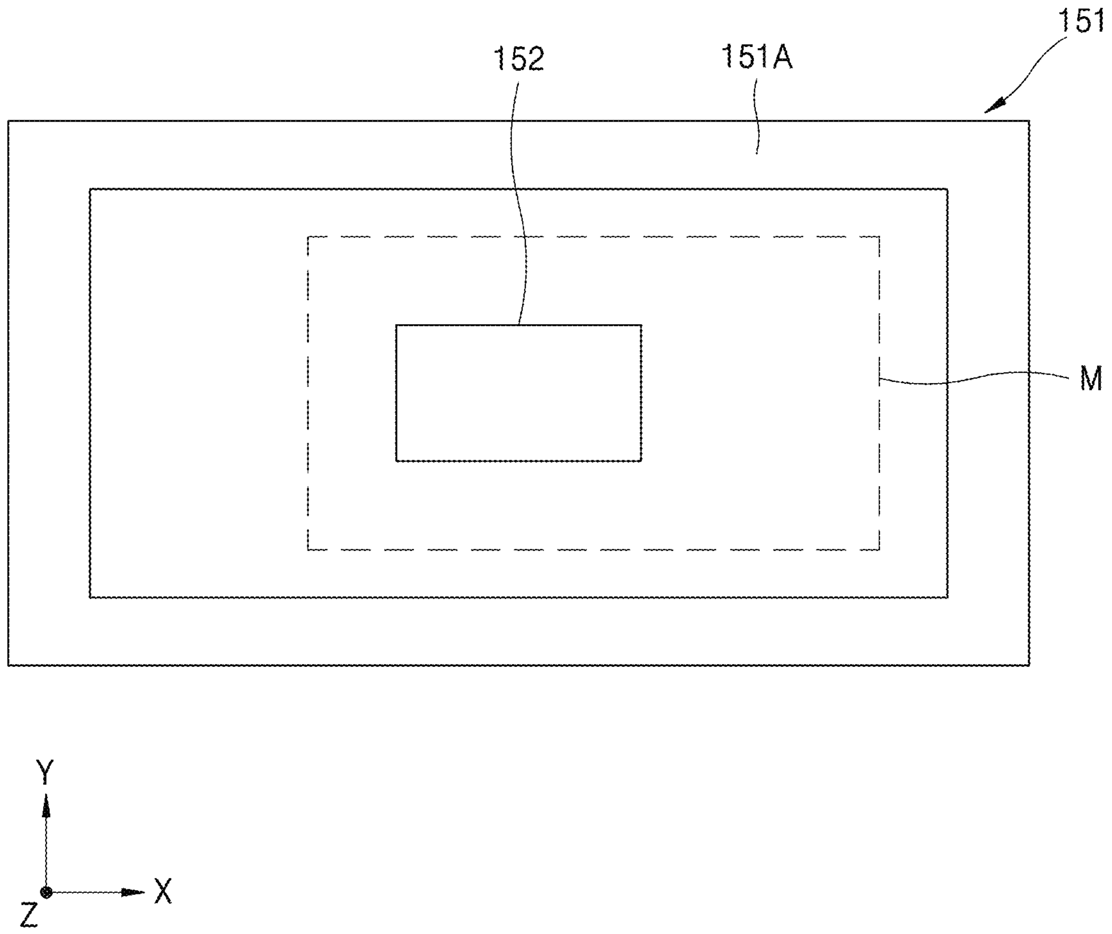
FIG. 2 is a top plan view illustrating an embodiment of a positional relationship between a suction pipe and a base member of the apparatus in FIG. 1.

FIG. 1 is a cross-sectional view illustrating an embodiment of a manufacturing apparatus with which a display apparatus is manufactured. FIG. 2 is a top plan view illustrating an embodiment of a positional relationship between a suction pipe and a base member of the manufacturing apparatus in FIG. 1.

Referring to FIGS. 1 and 2, an apparatus 100 with which a display apparatus is manufactured may include a feeder 110, a polisher 120, a polishing head 130, a conveyer 140, and a suction unit 150.

A base member M is supplied from outside the apparatus 100 and mounted on the feeder 110. In this case, the feeder 110 may include a first support 111, a first roller 112, and a first driver 113. The first support 111 may include a plurality of frames that are connected to one another. A frame among the plurality of frames may be fixed such as to the ground, an inner surface of a building, or the like, to fix a position of the first support 111.

The first roller 112 may be located on or connected to the first support 111 and rotatable about a rotation axis. The first roller 112 may be provided in plural (e.g., a plurality of first rollers 112), and may each be located on or connected to the first support 111 to be spaced apart from one another along a length of first support 111. The first driver 113 may be connected to the first roller 112 and may drive the first roller 112 to rotate the first roller 112 about the rotation axis.

The first driver 113 may be connected to first roller 112 among the plurality of first rollers 112. In an embodiment, for example, the first driver 113 may include a motor. The first driver 113 may be provided in plural (e.g., a plurality of first drivers 113) to respectively correspond to the first rollers 112, without being limited thereto. In another embodiment, the first driver 113 may include a chain connected to each of the plurality of first rollers 112, a sprocket connected to the chain and the first rollers 112, and a motor connected to the sprocket. The chain may be movable by actuation of the first driver 113. The first driver 113 is not limited thereto, and may include any device and structure connected to each of the plurality of first rollers 112 to rotate the first rollers 112 or connected to a portion or all of the plurality of first rollers 112 to simultaneously drive and rotate the plurality of first rollers 112. However, for convenience of explanation, the following description includes a single one of the first driver 113 corresponding to an individual one of the first roller 112 and drives the first roller 112 to rotate the first roller 112.

The polisher 120 may provide polishing of the base member M supplied by the feeder 110. The polisher 120 may include a belt 121 on which the base member M is placed and movable relative to the polishing head 130, a second roller 122 provided in plural (e.g., second rollers 122) respectively located at opposing ends of the belt 121 such as inside the belt 121, and a second driver 123 for driving the second roller 122.

The belt 121 may be wound around the second roller 122, and a position of the belt 121 may vary as the second roller 122 rotates. Also, a plurality of second rollers 122 may be provided, and may be spaced apart from one another along a length of the polisher 120 to maintain the tension of the belt 121 at a constant level. The second driver 123 may include a motor or the like, and may be located corresponding to the second roller 122 to drive and rotate the second roller 122. In this case, the second driver 123 may correspond to at least one of the plurality of second rollers 122.

In addition, the polisher 120 may further include a second support 124 located on the belt 121. In this case, the base member M may be placed on the second support 124, and the second support 124 may support the base member M during polishing of a surface of the base member M. The second support 124 may be a plate-type support.

The polishing head 130 may be located to correspond to the polisher 120. In an embodiment, for example, the polishing head 130 may be located over a surface of the belt 121 on which the second support 124 is provided. In this case, the polishing head 130 may be movable in various directions. In an embodiment, for example, the polishing head 130 may be movable in at least one direction from among an X-direction, a Y-direction, and a Z-direction of FIG. 1. A surface of the base member M which is polishable at the polisher 120 may be disposed in a plane defined by the X-direction and the Y-direction.

The polishing head 130 may include a polishing head body 131, a polishing head rotator 132, a polishing pad 133, and a polishing driver 134. The polishing head body 131 may be connected to the polishing driver 134 and may be linearly movable by actuation of the polishing driver 134. Also, the polishing head rotator 132 may be rotatably connected to the polishing head body 131. In this case, the polishing pad 133 may be connected to the polishing head rotator 132, and be rotatable by rotation of the polishing head rotator 132. The polishing pad 133 may be a plate-type pad located on a lower surface of the polishing head rotator 132 and with which a surface of the base member M is polished.

The polishing driver 134 may include a first polishing driver 134A and a second polishing driver 134B. The first polishing driver 134A is connected to the polishing head body 131 and the polishing head rotator 132 may be rotated by operation of the first polishing driver 134A. The first polishing driver 134A may extend into and/or through the polishing head body 131 to be connected to the polishing head rotator 132, without being limited thereto. The second polishing driver 134B corresponds to and/or is connected to the polishing head body 131 and the polishing head body 131 may be linearly moved by operation of the second polishing driver 134B.

The first polishing driver 134A may include a motor connected to the polishing head rotator 132 and with which the polishing head rotator 132 is rotated. In another embodiment, the first polishing driver 134A may include a motor connected to the polishing head rotator 132 and with which the polishing head rotator 132 may be rotated and a decelerator located between the motor and the polishing head rotator 132.

The second polishing driver 134B may linearly move the polishing head body 131 by using any of various methods. In this case, at least one second polishing driver 134B may be provided. In an embodiment, for example, a plurality of second polishing drivers 134B may be provided, and each of the second polishing drivers 134B may linearly move the polishing head body 131 in one of the X-direction, the Y-direction, and the Z-direction of FIG. 1. In this case, the second polishing driver 134B may have any of various shapes. In an embodiment, for example, the second polishing driver 134B may include a cylinder. In another embodiment, the second polishing driver 134B may include a ball screw and a motor connected to the ball screw. In another embodiment, the second polishing driver 134B may include a linear motor. In this case, the second polishing driver 134B is not limited thereto, and may include any device and structure connected to the polishing head body 131 and with which the polishing head body 131 may be linearly moved in various directions. In this case, a first one of the plurality of second polishing drivers 134B may be connected to the polishing head body 131, and a second one among the plurality of second polishing drivers 134B may be connected to the first one among the second polishing drivers 134B connected to the polishing head body 131. Also, a third one among the plurality of second polishing drivers 134B may be connected to the second one among the plurality of polishing drivers 134. In this case, each second polishing driver 134B may linearly move the polishing head body 131 in a single one direction.

The conveyer 140 may be spaced apart from the polisher 120 and may transfer a base member M which is polished at the polisher 120. The conveyer 140 may include a third support 141, a third roller 142, and a third driver 143. In this case, the third support 141, the third roller 142, and the third driver 143 may be provided or formed to be the same as or similar to the first roller 112 and the first driver 113 of the feeder 110.

The conveyer 140 may transfer the base member M from the polisher 120 and may carry the base member M to outside the apparatus 100. Along the apparatus 100 (e.g., a moving direction indicated arrows in the X-direction), the suction pipe 151 precedes the polisher 120, while the conveyer 140 follows the polisher 120 and an area outside the apparatus 100 follows the conveyer 140. In an embodiment, for example, the conveyer 140 may feed the base member M to an external cleaner (not shown) which is disposed outside of the apparatus 100.

The suction unit 150 may face the conveyer 140. The suction unit 150 may include a suction pipe 151, a connection pipe 152, a pump 153, and a valve 154.

The suction pipe 151 may face a portion of each of the polisher 120 and the conveyer 140. The suction pipe 151 may be open to the portions of the polisher 120 and the conveyer 140, as illustrated in FIG. 1. In this case, a planar area of an inlet portion 151A of the suction pipe 151 which is defined along the X-direction and the Y-direction, may be greater than a total planar area of the base member M as shown in FIG. 2. That is, in a top plan view, an edge (or an end portion, the edge defined by the inlet portion 151A) of the suction pipe 151 may surround an edge of the base member M, such that an entirety of the edge of the base member M may be located inside the edge of the suction pipe 151. In this case, the inlet portion 151A of the suction pipe 151 may completely cover a front surface of a substrate 21 (see FIGS. 6-9) of a display apparatus.

The inlet portion 151A of the suction pipe 151 may extend from the connection pipe 152 and include a horizontal portion (e.g., extending along the X-direction in FIG. 1), and a vertical portion extending from ends of the horizontal portion. Walls of the suction pipe 151 at the vertical portion may define the inlet portion 151A of the suction pipe 151 and may be inclined. In an embodiment, for example, the inlet portion 151A of the suction pipe 151 may be inclined in a height direction (e.g., the Z-direction of FIG. 1). In this case, a width of the inlet portion 151A of the suction pipe 151 along the X-direction may decrease in a direction toward the connection pipe 152. That is, an internal planar area of the suction pipe 151 taken in the plane defined by the X-direction and the Y-direction may gradually decrease from the edge of the suction pipe 151 (e.g., at a distal end of the inlet portion 151A) along the height direction of the suction pipe 151.

The connection pipe 152 may be connected to the suction pipe 151. The connection pipe 152 may be in fluid connection with the suction pipe 151 which is open to outside the suction unit 150 at the polisher 120 and the conveyer 140. In this case, the connection pipe 152 may guide a gas from the suction pipe 151 to outside the suction unit 150 and/or the apparatus 100. In this case, a cross-sectional area of the connection pipe 152 may be less than a cross-sectional area of the suction pipe 151. The connection pipe 152 connected to the suction pipe 151 may provide a flow passage through which a material (e.g., solid, gas, etc.) is transferred from the inlet portion 151A to outside the suction unit 150 and/or the apparatus 100.

The pump 153 may correspond to and be connected to the connection pipe 152, such as in fluid connection therewith. Actuation of the pump 153 may provide a suction force to draw a material such as a gas from around a portion of the polisher 120 and the conveyer 140, through the suction pipe 151. In this case, the pump 153 may be of any of various types. In an embodiment, for example, the pump 153 may adjust flow of a gas through the connection pipe 152 so that the gas has a constant pressure within the suction unit 150. In another embodiment, the pump 153 may adjust a flow of gas through the connection pipe 152 so that a pressure of the gas varies within the suction unit 150.

The valve 154 may correspond to and/or be connected to the connection pipe 152, such as being in fluid connection therewith. In this case, the valve 154 may be located between the suction pipe 151 and the pump 153 or may be located at a rear end of the pump 153. For convenience of explanation, the following will be described in detail assuming that the valve 154 is located at a rear end of the pump 153.

Actuation of the valve 154 may open or close the connection pipe 152. In this case, the valve 154 may include a solenoid valve that operates according to an external signal provided from outside the suction unit 150 and/or the apparatus 100. In an embodiment, for example, the valve 154 may interoperate with the pump 153, and may open the connection pipe 152 when the pump 153 operates. In contrast, the valve 154 may interoperate with the pump 153, and may not open the connection pipe 152 when the pump 153 does not operate. In another embodiment, actuation of the valve 154 may adjust a degree of opening of the connection pipe 152 to adjust the internal pressure of the connection pipe 152 regardless of operation of the pump 153.

An operation of the apparatus 100 will now be described in detail.

Figure 3:
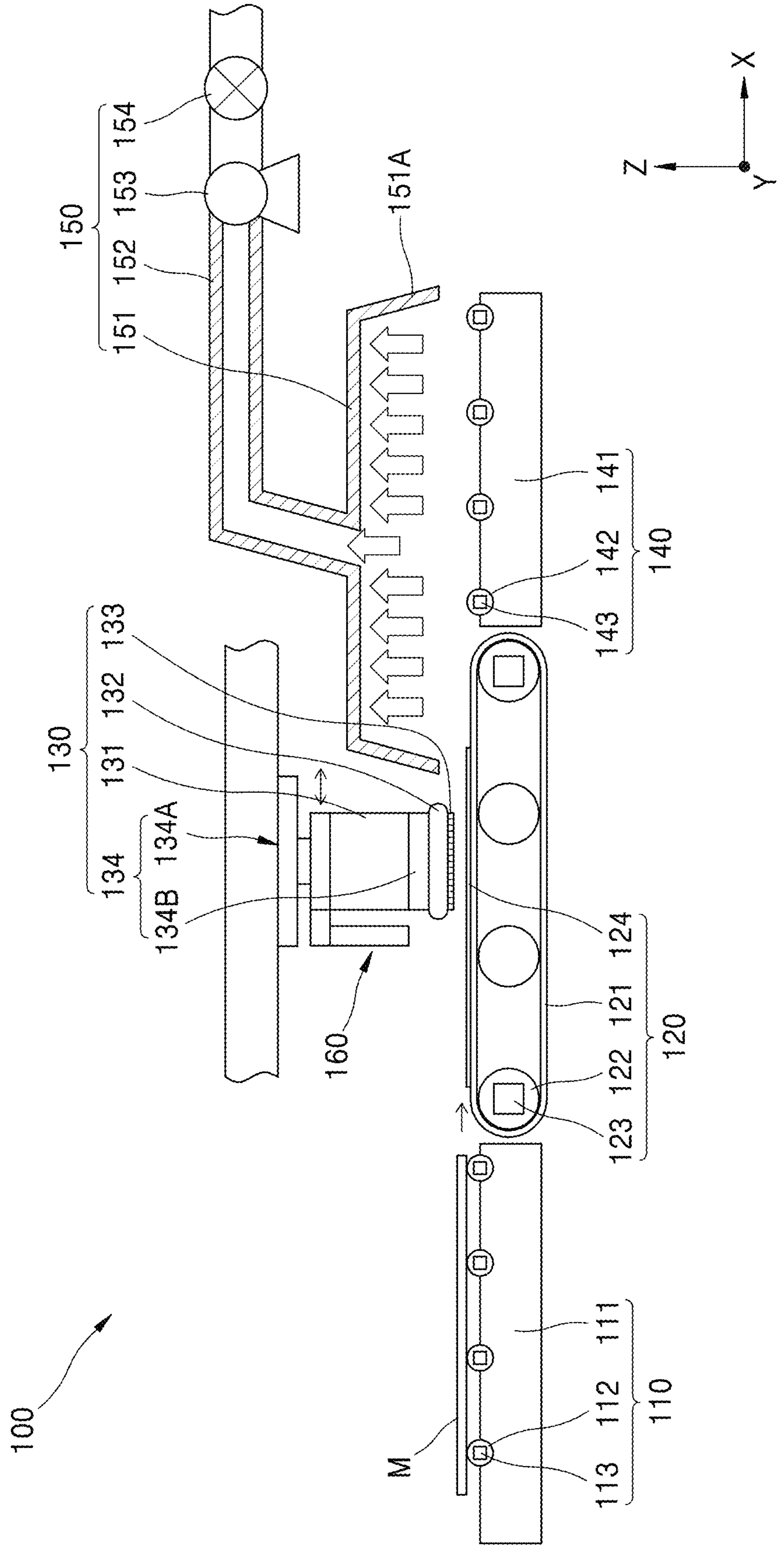
FIGS. 3 to 5 are cross-sectional views of embodiments of processes in a method of operating the apparatus for manufacturing a display apparatus of FIG. 1.

FIG. 3 is a cross-sectional view illustrating an embodiment of a process in a method of operating the apparatus 100 of FIG. 1, for manufacturing a display apparatus.

Referring to FIG. 3, the base member M may be provided on the feeder 110 from outside the apparatus 100 by using any of various methods. In an embodiment, for example, the base member M may be fed to the feeder 110 by using a robot arm. In another embodiment, a user may manually supply the base member M to the feeder 110 such as by using a separate mechanism.

The base member M may be directly provided on the feeder 110, or may be mounted on a carrier member (not shown) which is provided on the feeder 110. In this case, the carrier member may be a plate-type member including glass or the like. For convenience of explanation, the following will be described in detail assuming that the base member M is directly provided on the feeder 110.

The base member M may be of any of various types. In an embodiment, for example, the base member M may be used to manufacture a single display apparatus (not shown) (e.g., corresponds to a single display apparatus). In another embodiment, the base member M may be used to manufacture a plurality of display apparatuses (e.g., corresponds to a plurality of display apparatuses). In this case, after a plurality of display units (not shown) of respective ones of the display apparatuses are provided or formed on the base member M, the base member M may be divided into a plurality of portions to respectively correspond to the plurality of display units for a plurality of display apparatuses.

The base member M may include various materials. For example, the base member M may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The base member M may have a multi-layer structure including a layer including the polymer resin and an inorganic layer (not shown). For convenience of explanation, the following will be described in detail assuming that the base member M includes glass.

The base member M may be movable according to an operation of the first driver 113. In this case, the first roller 112 may rotate according to an operation of each first driver 113. In this case, an elastic material such as rubber or silicone may be located on an outer surface of the first roller 112 to increase a frictional force between the first roller 112 relative to the base member M.

Figure 4:
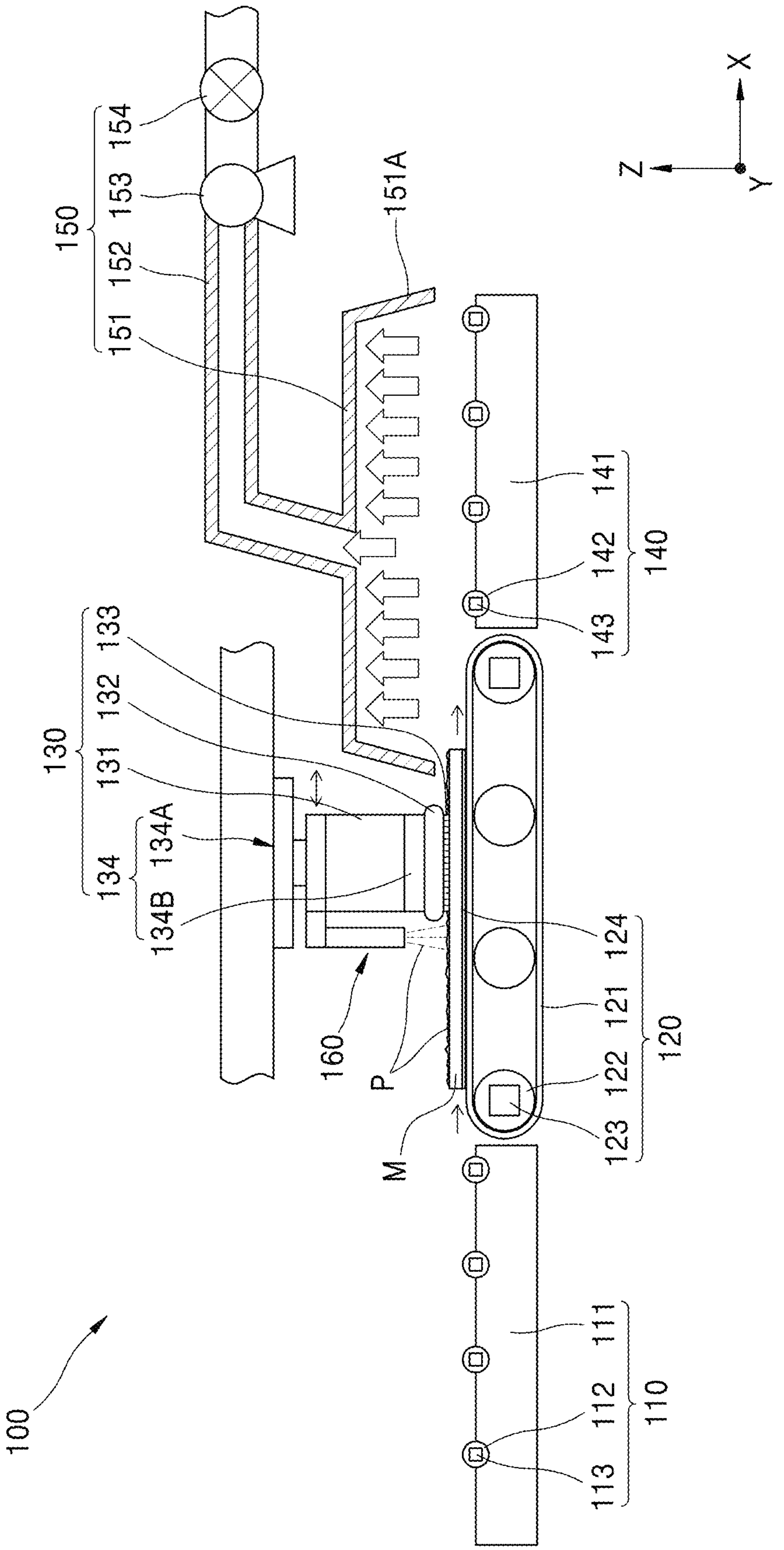

FIG. 4 is a cross-sectional view illustrating an embodiment of another process in a method of operating the apparatus 100 of FIG. 1 for manufacturing a display apparatus.

Referring to FIG. 4, the base member M may move from the feeder 110 to the polisher 120 (right arrow between the feeder 110 to the polisher 120). In this case, the first driver 113 and the second driver 123 may interoperate with each other. When the second driver 123 operates, the second roller 122 may rotate to rotate the belt 121. Interoperation of the first driver 113 and the second driver 123 may provide the base member M onto the belt 121.

The second driver 123 may operate to rotate the belt 121 which transfers the base member M along a movement direction (e.g., X-direction) and provide the base member at a preset position along the polisher 120. In this case, the base member M may be located under the polishing head 130.

Termination of operation of the second driver 123 may stop movement of the belt 121 and fix a position of the base member M along the polisher 120. Operation of the first polishing driver 134A and/or the second polishing driver 134B may linearly move the polishing head 130 to correspond to a surface of the base member M. The polishing head 130 may be contacted with the surface of the base member M to polish the surface.

While or before the polishing is performed, a polishing material P may be supplied to the surface of the base member M. In this case, the polishing material P may be supplied by using any of various methods. In an embodiment, for example, the polishing material P may be supplied to the base member M through the polishing head 130. In an embodiment, for example, the polishing material P may be supplied from outside the polishing head 130 through a flow path provided or formed in the polishing head 130, to the base member M. In this case, a hole through which the polishing material P is supplied may be provided or formed in the polishing pad 133. That is the flow path and the hole in the polishing pad 133 may be fluidly connected with each other.

In another embodiment, the polishing material P may be supplied to the surface of the base member M by a polishing material supplier 160 that is provided separately from the polishing head 130. In this case, the polishing material supplier 160 may be a nozzle-type supplier. For convenience of explanation, the following will be described in detail assuming that the polishing material supplier 160 is provided separately from the polishing head 130 and the polishing material P is supplied to the base member M before the polishing head 130 operates.

The polishing material P with which the surface of the base member M is polished, may include deionized water ("DIW"), a surfactant, and slurry.

In an embodiment, while the surface of the base member M is polished by using the polishing head 130 and the polishing material P, the base member M may be supported by the second support 124. That is, the second support 124 may support the base member M and thus may reduce or effectively prevent the base member M from moving during the operation of the polishing head 130.

In another embodiment, the base member M may be temporarily supported by another support structure similar to the second support 124. In an embodiment, for example, a separate frame may be temporarily supported between the belt 121 and the base member M, or a portion of the belt 121 on which the base member M is mounted may have a thickness and a hardness different from remaining portions of the belt 121, and may support the base member M during polishing of the base member M. In this case, a method of supporting the base member M during polishing of the base member M is not limited thereto. Any device and structure for minimizing the movement of the base member M during polishing of the base member M by the polishing head 130 may be used, so long as a same pressure is provided by the polishing head 130 over an entirety of the surface of the base member M. That is, within a same one of the base member M, a first portion of the surface which is polished (e.g., post-polishing portion), a second portion of the surface being actively polished and a third portion of the surface which is not yet polished (e.g., pre-polishing portion) are each supported by the device and structure for minimizing the movement of the base member M at the polisher 120 such that the polishing head 130 applies the same pressure over the entire surface of the base member M.

When the polishing of the surface of the base member M is completed, a portion of the polishing material P may remain on the polished surface of the base member M. In this case, the second driver 123 and the third driver 143 may operate to feed the base member M having the portion of the polishing material P remaining thereon, to the conveyer 140.

Figure 5:
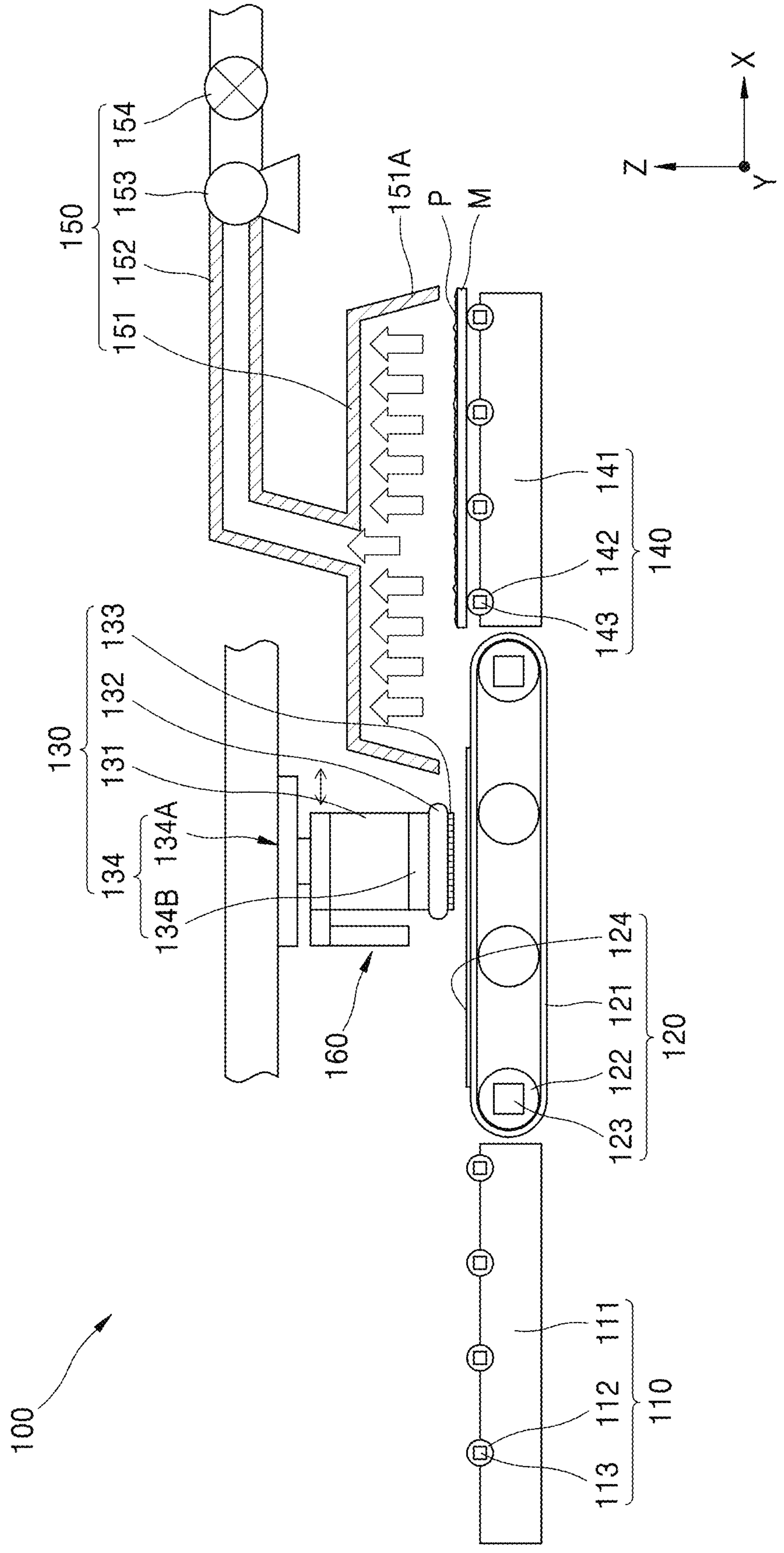

FIG. 5 is a cross-sectional view illustrating an embodiment of still another process in a method of operating the apparatus 100 of FIG. 1 for manufacturing a display apparatus.

Referring to FIG. 5, the base member M fed to the conveyer 140 may be provided in a static position on the conveyer 140 before being conveyed to another external apparatus or device (e.g., a cleaner external to the apparatus 100 (not shown)). In this case, the polishing material P remaining on the base member M may be dried, and the dried polishing material P may be stuck to the surface of the base member M. In particular, the polishing material P on the base member M may be removable by a separate cleaner, but when the polishing material P is dried, the polishing material P may not be completely removed from the base member M and may fail to be separated from the base member M.

In order to improve removal of the polishing material P which is dried to promote complete removal and separation thereof from the base member M which is polished, operation of the pump 153 may reduce or effectively prevent the polishing material P from flowing along a surface of the base member M and over edges thereof to flow down from the base member M (e.g., in a gravity direction or direction opposite to the Z-direction in FIG. 5). In particular, the pump 153 may operate to minimize the flow or evaporation of a liquid (e.g., deionized water) of the polishing material P over the edge of the base member M and along a side surface of the base member M.

In detail, from a time where the base member M is fed from the polisher 120 to the conveyer 140, to a time where the base member M is located on the conveyer 140, the suction unit 150 may reduce or effectively prevent separation of the polishing material P from the base member M from the flow or evaporation described above. That is, when the pump 153 operates, a gas may be drawn into the suction pipe 151, such as from an environment outside thereof. In this case, because the apparatus 100 for manufacturing a display apparatus is located in an atmospheric pressure state, a pressure different from an atmospheric pressure may be provided or formed around the suction pipe 151. A pressure at the surface of the base member M which is unpolished may define an atmospheric pressure and may be different from a pressure at the polished surface of the base member M which is polished.

In an embodiment, for example, the pressure around the suction pipe 151 (or a pressure inside the suction pipe 151) may be lower than the atmospheric pressure. In this case, a pressure around a portion of the polisher 120 and the conveyer 140, and consequently at the polished surface of the base member M at the portion of the polisher 120 and the conveyer 140, may be lower than that at remaining portions of the apparatus 100. That is, the pressure around the portion of the polisher 120 and the conveyer 140 may be lower than the atmospheric pressure. In this case, the pump 153 may enable a pressure inside the connection pipe 152 and the suction pipe 151 to be similar to a pressure in a vacuum state. That is, the suction unit 150 corresponding to at least the conveyer 140 and a portion of the polisher 120 provides a pressure around the conveyer 140 to be lower than a pressure at remaining portions of the apparatus 100 (e.g., atmospheric pressure).

In this case, as a gas around the portion of the polisher 120 and the conveyer 140 is drawn into the suction pipe 151 (upward arrows within the suction pipe 151 in FIG. 5), the polishing material P on the base member M may be forced in a direction toward the suction pipe 151 (e.g., along the Z-direction) without being drawn into the suction pipe 151. At this time, the polishing material P (e.g., specifically a liquid component thereof) may not be separated from the base member M due to surface tension between the base member M and the polishing material P.

In this case, the pump 153 and/or the valve 154 may adjust a pressure inside the connection pipe 152 and/or the suction pipe 151. Also, when walls of the suction pipe 151 at the inlet portion 151A thereof are inclined as described above, the internal area of the suction pipe 151 may gradually decrease from an entrance thereof through which a gas is introduced along a height direction, and a gas may be drawn up over the entire planar area of the base member M.

The suction unit 150 may continuously perform a suction function until the base member M is provided outside a planar area of the suction pipe 151.

The base member M may be supplied to the cleaner (not shown) or the like to remove the polishing material P which remains on the base member M after the conveyer 140. In an embodiment, after removal of the polishing material P which remains on the base member M after the conveyer 140, various layers of a display unit D and/or a display apparatus 20 or 20' may be provided on the base member M which is polished, thereby manufacturing a display apparatus.

In this case, when the base member M is transferred outside of the apparatus 100, deionized water of the polishing material P which remains on the base member M may be equal to or greater than about 90% of a total weight of the polishing material P. In this case, when deionized water of the polishing material P which remains on the base member M is less than about 90% of the total weight of the polishing material P, slurry within the polishing material P which remains on the base member M may not be properly removed during cleaning of the base member M, and thus, stains may be produced on the base member M or a flatness of the polished surface of the base member M may be reduced. That is, operation of the suction unit 150 maintains the liquid in the remaining portion of the polishing material P on a polished surface of the polished form of the base member M at a level equal to or greater than about 90% of a total weight of the remaining portion of the polishing material M on the polished form of the base member M.

Accordingly, since one or more embodiment of the apparatus 100 and method of manufacturing a display apparatus using the same, reduces or effectively prevents separation of the polishing material P (e.g., specifically a liquid component thereof) from the base member M which is polished to promote complete removal and separation of the polishing material P remaining on the base member M which is polished, supply of a separate liquid to minimize or effectively prevent drying of the polishing material P on the base member M after polishing may be obviated.

Since one or more embodiment of the apparatus 100 and method of manufacturing a display apparatus using the same omit removal of the polishing material P at the feeder 110, the polisher 120, the polishing head 130, and/or the conveyer 140, the possibility of scattering of the polishing material P during removal such as by using a nozzle or the like is reduced or effectively prevented. Thus, contamination by polishing material P which is scattered at one of the feeder 110, the polisher 120, the polishing head 130, and the conveyer 140 is reduced or effectively prevented.

One or more embodiment of the apparatus 100 and method of manufacturing a display apparatus using the same may provide a uniformly planarized surface of the base member M after the base member M is polished.

Figure 6:
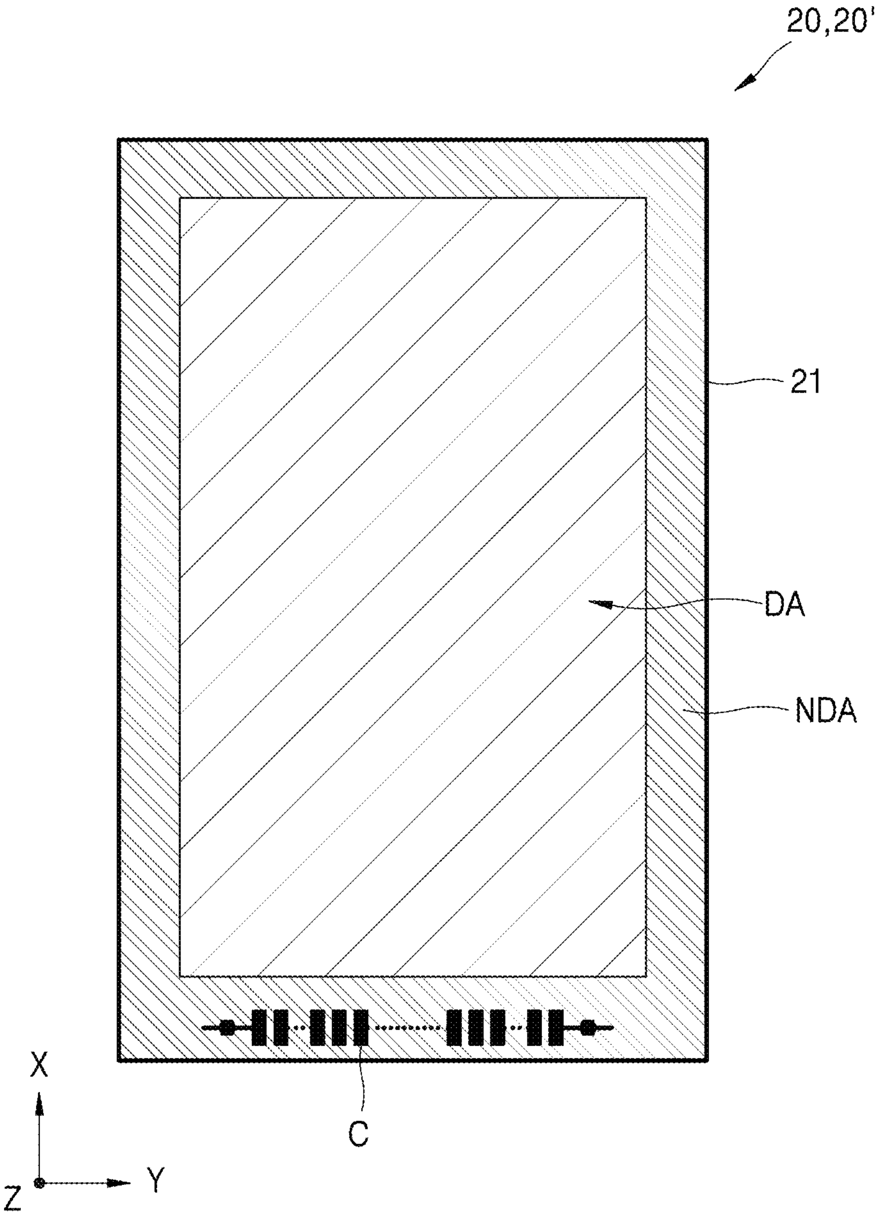
FIG. 6 is a top plan view illustrating an embodiment of a display apparatus.

FIG. 6 is a top plan view illustrating an embodiment of a display apparatus 20 or 20'.

Referring to FIG. 6, in a display apparatus 20 or a display apparatus 20', the substrate 21 may include a display area DA and the non-display area NDA which is outside the display area DA. A display unit D may be located in the display area DA, and a power supply wiring (not shown) may be located in the non-display area NDA. Also, a pad unit C may be located in the non-display area NDA. An image may be displayed at the display area DA. The image may be generated and/or displayed by the display unit D. The power supply wiring and/or the pad unit C may be connected to the display unit D, for driving the display unit D to generate and/or display the image. In one or more embodiment, the substrate 21 may be the base member M previously described with respect to the apparatus 100, without being limited thereto.

Figure 7:
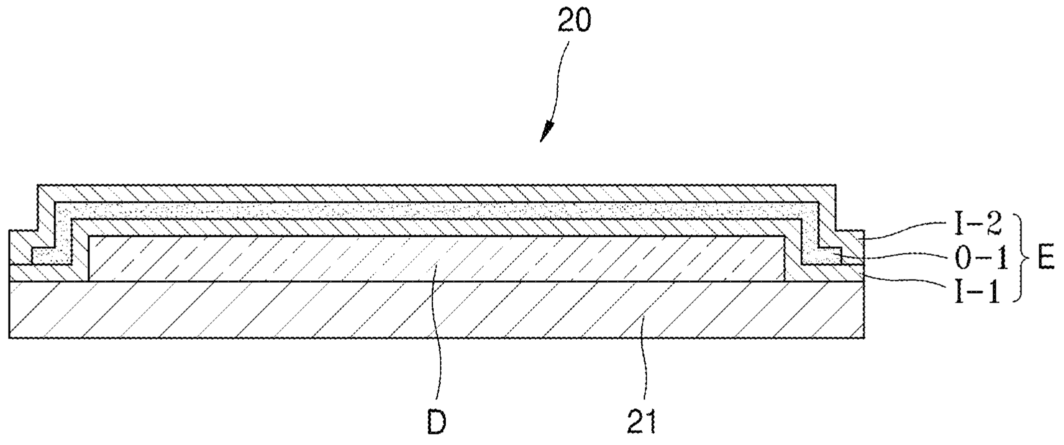
FIG. 7 is a cross-sectional view illustrating an embodiment of the display apparatus of FIG. 6.
Figure 8:
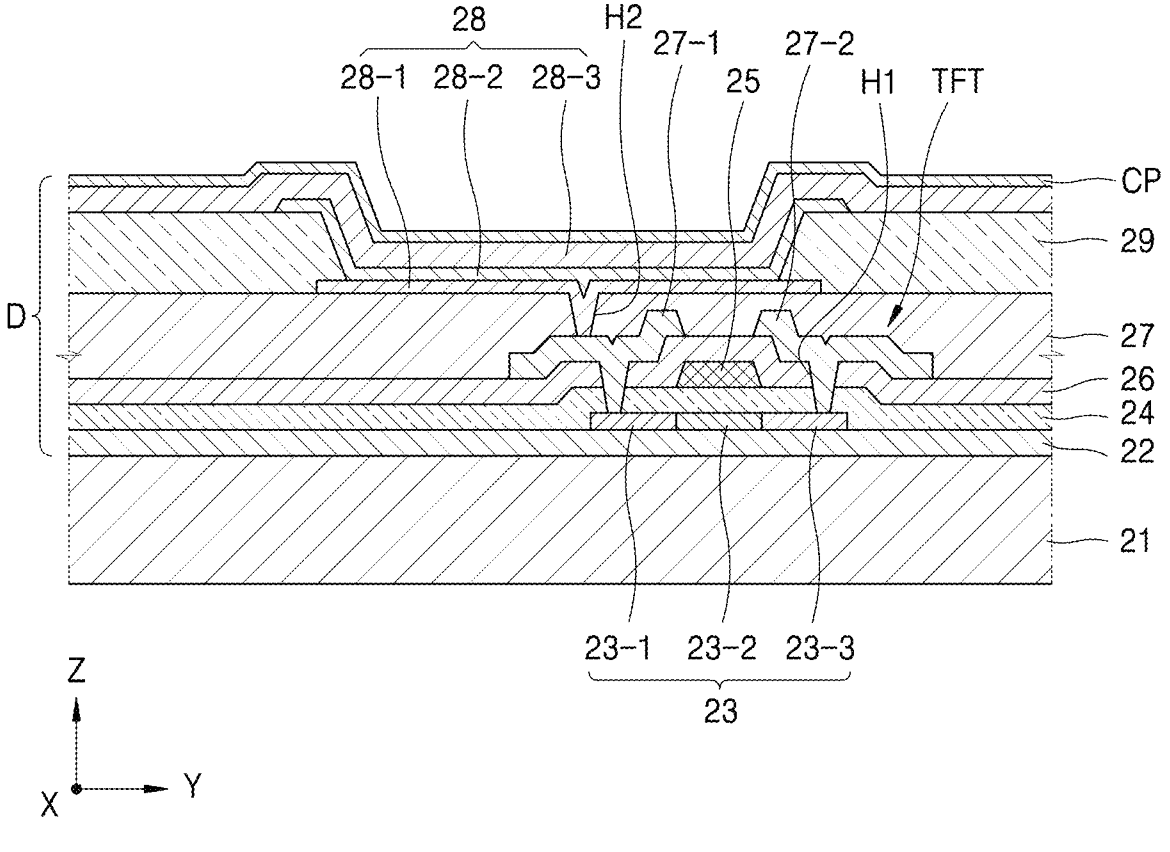
FIG. 8 is an enlarged cross-sectional view illustrating the display apparatus of FIG. 7.

FIG. 7 is a cross-sectional view illustrating an embodiment of the display apparatus 20. FIG. 8 is an enlarged cross-sectional view of an embodiment of a portion of a display unit of the display apparatus 20 of FIG. 7.

Referring to FIGS. 7 and 8, the display apparatus 20 may include the substrate 21, a display unit D, and a thin-film encapsulation layer E. In this case, the display unit D may include a thin-film transistor ("TFT"), a passivation film 27, and a pixel electrode 28-1.

The substrate 21 may include a glass material or a polymer resin. In this case, the polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate or cellulose triacetate. The polymer resin may be transparent. In this case, the substrate 21 may have a single or multi-layer structure including the polymer resin.

The substrate 21 may be provided or formed by using the base member M of FIGS. 1 through 5. In an embodiment, for example, one of the base member M may be polished and then one of the substrate 21 may be provided or formed from the one of the base member M. In another embodiment, one base member M may be polished and then may be divided such as being cut, or a plurality of display units D may be provided or formed on the base member M and then may be respectively separated from remaining portions of the base member M such as by being cut, to provide a plurality of substrates 21 from which a plurality of display apparatuses 20 are respectively provided.

The TFT may be provided or formed on the substrate 21, the passivation film 27 may be provided or formed to cover the TFT, and an organic light-emitting device ("OLED") 28 may be provided or formed on the passivation film 27.

A buffer layer 22 included or formed of an organic material and/or an inorganic material may be further provided or formed on a top surface of the substrate 21 and may include SiOx (x≥1) or SiNx (x≥1).

An active layer 23 arranged in a predetermined pattern is provided or formed on the buffer layer 22, the active layer 23 is covered by a gate insulating layer 24. The active layer 23 includes a source region 23-1 and a drain region 23-3, and further includes a channel region 23-2 between the source region 23-1 and the drain region 23-3.

The active layer 23 may include various materials. In an embodiment, for example, the active layer 23 may include an inorganic semiconductor material such as amorphous silicon or crystalline silicon. Alternatively, the active layer 23 may include an oxide semiconductor. Alternatively, the active layer 23 may include an organic semiconductor material. However, for convenience of explanation, the following will be described in detail assuming that the active layer 23 includes or is formed of amorphous silicon.

The active layer 23 may be defined by providing or forming an amorphous silicon film on the buffer layer 22, crystallizing the amorphous silicon film into a polycrystalline silicon film, and patterning the polycrystalline silicon film. The source region 23-1 and the drain region 23-3 are doped with impurities according to a type of the TFT such as a driving TFT (not shown) or a switching TFT (not shown).

A gate electrode 25 corresponding to the active layer 23 and an interlayer insulating layer 26 covering the gate electrode 25 are provided or formed on a top surface of the gate insulating layer 24.

A contact hole H1 is provided or formed in the interlayer insulating layer 26 and the gate insulating layer 24, a source electrode 27-1 and a drain electrode 27-2 are provided or formed on the interlayer insulating layer 26 to respectively contact the source region 23-1 and the drain region 23-3.

The passivation film 27 is provided or formed on the TFT, and the pixel electrode 28-1 of the OLED 28 is provided or formed on the passivation film 27. The pixel electrode 28-1 contacts the drain electrode 27-2 of the TFT at a via hole H2 provided or formed in the passivation film 27. The passivation film 27 may have a single or multi-layer structure including an inorganic material and/or an organic material, and may be provided or formed as a planarization film having a flat top surface regardless of a curvature of a lower film or may be provided or formed to be curved according to a curvature of a lower film. The passivation film 27 may include a transparent insulating material to achieve a resonance effect.

After the pixel electrode 28-1 is provided or formed on the passivation film 27, a pixel-defining film 29 is provided or formed by using an organic material and/or an inorganic material to cover the pixel electrode 28-1 and the passivation film 27, and an opening is provided or formed to expose the pixel electrode 28-1.

An intermediate layer 28-2 and a counter electrode 28-3 are provided or formed on the pixel electrode 28-1, such as to correspond to a single one of the pixel electrode 28-1. In another embodiment, the counter electrode 28-3 may be provided or formed over an entirety of the display unit D, such as to be commonly provided for more than one of the pixel electrode 28-1. In this case, the counter electrode 28-3 may be provided or formed on the intermediate layer 28-2 and the pixel-defining film 29. For convenience of explanation, the following will be described in detail assuming that the counter electrode 28-3 is provided or formed on the intermediate layer 28-2 and the pixel-defining film 29.

The pixel electrode 28-1 functions as an anode and the counter electrode 28-3 functions as a cathode, or vice versa.

The pixel electrode 28-1 and the counter electrode 28-3 are insulated from each other by the intermediate layer 28-2, and an organic emission layer emits light by applying voltages having different polarities to the intermediate layer 28-2.

The intermediate layer 28-2 may include the organic emission layer. As a selective example, the intermediate layer 28-2 may include the organic emission layer, and may further include at least one of a hole injection layer ("HIL"), a hole transport layer ("HTL"), an electron transport layer ("ETL"), and an electron injection layer ("EIL"). The invention is not limited thereto, and the intermediate layer 28-2 may include the organic emission layer and may further include other various functional layers (not shown).

A plurality of intermediate layers 28-2 may be discretely provided as patterns, to form the display area DA. In particular, the plurality of intermediate layers 28-2 may form the display area DA having a shape other than a rectangular shape or a square shape. In this case, the plurality of intermediate layers 28-2 may be located inside the display area DA to be spaced apart from one another.

One unit pixel of the display apparatus 20 may include a plurality of sub-pixels at which various colors are generated and/or emitted. In an embodiment, for example, the plurality of sub-pixels may include sub-pixels that emit red light, green light, and blue light, and/or may include sub-pixels that emit red light, green light, blue light, and white light.

The thin-film encapsulation layer E may include a plurality of inorganic layers, or may include an inorganic layer and an organic layer.

The organic layer of the thin-film encapsulation layer E may include or be formed of a polymer, and preferably, and may have a single or multi-layer structure including one of polyethyleneterephthalate, polyimide, polycarbonate, epoxy, polyethylene, and polyacrylate. More preferably, the organic layer may include polyacrylate, and in detail, may include a polymerized monomer including a diacrylate-based monomer and a triacrylate-based monomer. The monomer may further include a monoacrylate-based monomer. Also, the monomer may further include any suitable photo-initiator such as 2,4,6-trimethylbenzoyldiphenyl phosphine oxide ("TPO"), but the present disclosure is not limited thereto.

The inorganic layer of the thin-film encapsulation layer E may have a single or multi-layer structure including a metal oxide or a metal nitride. In detail, the inorganic layer may include one of SiNx, $Al_2O_3$, $SiO_2$, and $TiO_2$.

An uppermost layer of the thin-film encapsulation layer E that is exposed to outside the display apparatus 20 may be an inorganic layer to reduce or effectively prevent penetration of moisture into the OLED 28.

The thin-film encapsulation layer E may include at least one sandwich structure in which at least one organic layer is between at least two inorganic layers. Alternatively, the thin-film encapsulation layer E may include at least one sandwich structure in which at least one inorganic layer is between at least two organic layers. Alternatively, the thin-film encapsulation layer E may include a sandwich structure in which at least one organic layer is between at least two inorganic layers and a sandwich structure in which at least one inorganic layer is between at least two organic layers.

The thin-film encapsulation layer E may include a first inorganic layer I-1, a first organic layer O-1, and a second inorganic layer I-2 that are sequentially stacked on the OLED 28 of the display unit D.

Alternatively, the thin-film encapsulation layer E may include the first inorganic layer I-1, the first organic layer O-1, the second inorganic layer I-2, a second organic layer, and a third inorganic layer that are sequentially stacked on the OLED 28 of the display unit D.

Alternatively, the thin-film encapsulation layer E may include the first inorganic layer I-1, the first organic layer O-1, the second inorganic layer I-2, the second organic layer, the third inorganic layer, and a fourth inorganic layer that are sequentially stacked on the OLED 28 of the display unit D.

A capping layer CP may be formed between the OLED 28 and the first inorganic layer I-1. The capping layer CP may include LiF. Alternatively, the capping layer CP may include an inorganic insulating material such as silicon nitride and/or may include an organic insulating material. In embodiments, the capping layer CP may be omitted.

Although not shown in FIGS. 7 and 8, the first organic layer O-1 may have a planar area less than that of the second inorganic layer I-2, and the second organic layer may have a planar area less than that of the third inorganic layer.

Accordingly, the display apparatus 20 may display a precise image.

Figure 9:
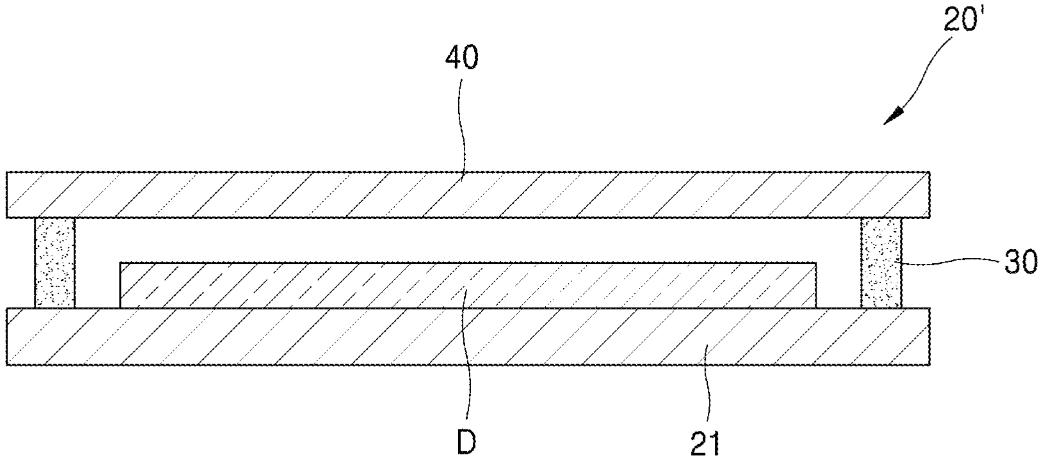
FIG. 9 is a cross-sectional view illustrating another embodiment of the display apparatus in FIG. 6.

FIG. 9 is a cross-sectional view illustrating an embodiment of a display apparatus 20'.

Referring to FIG. 9, the display apparatus 20' may include the substrate 21, the display unit D, an encapsulation substrate 40, and a sealing portion 30. In this case, the substrate 21 and the display unit D are the same as or similar to those described above, and thus a detailed explanation thereof will not be given.

The encapsulation substrate 40 may face the substrate 21. In this case, the encapsulation substrate 40 may include a material that is the same as or similar to that of the substrate 21.

The sealing portion 30 may be located between the encapsulation substrate 40 and the substrate 21. In this case, the sealing portion 30 may be hardened and then may melt when energy is supplied to fix the encapsulation substrate 40 to the substrate 21.

According to one or more of a display apparatus 20 or a display apparatus 20', stains are omitted from the substrate 21 on which various layers are provided.

According to one or more embodiment of an apparatus and method of manufacturing a display apparatus 20 or a display apparatus 20' using the same, a substrate 21 having uniform quality along a surface thereof may be manufactured.

According to one or more embodiment of an apparatus and method of manufacturing a display apparatus 20 or a display apparatus 20' using the same, a defect rate of a substrate 21 may be minimized.

According to one or more embodiment of an apparatus and method of manufacturing a display apparatus 20 or a display apparatus 20' using the same, contamination of peripheral devices or units of the apparatus during the manufacture of the display apparatus 20 or a display apparatus 20' may be minimized.

According to one or more embodiment of an apparatus and method of manufacturing a display apparatus 20 or a display apparatus 20' using the same, since a separate liquid is not supplied to a polishing material P which remains on a substrate 21 after polishing thereof, a size of the apparatus

100 may be reduced and the number of processes in manufacturing a display apparatus 20 or a display apparatus 20' may be reduced.

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:

providing a polishing material on a base member of the display apparatus which is unpolished, a pressure at the surface of the base member which is unpolished defining an atmospheric pressure;

polishing a surface of the base member which is unpolished with the polishing material to provide a polished base member having the polishing material on a polished surface; and providing a pressure at the polished surface of the polished base member which is different from the atmospheric pressure, wherein the pressure at the polished surface of the polished base member is lower than the atmospheric pressure defined at the surface of the base member which is unpolished.

2. The method of claim 1, wherein the polishing the surface of the base member comprises transferring the base member to a polisher of a manufacturing apparatus and transferring the polished base member from the polisher to outside the manufacturing apparatus by using a roller.

3. The method of claim 1, wherein the providing the polishing material on the base member comprises providing the base member on a belt of a manufacturing apparatus with which the base member is movable along the manufacturing apparatus.

4. The method of claim 1, wherein the providing the pressure comprises providing a suction pipe of a manufacturing apparatus facing the polished surface of the polished base member having the polishing material thereon and drawing a gas from around the polished base member into the suction pipe to provide the pressure at the polished surface which is different from the atmospheric pressure.

5. The method of claim 4, wherein the suction pipe comprises an inlet portion through which the gas from around the polished base member is drawn into to the suction pipe, and a wall of the suction pipe at the inlet portion is inclined.

6. The method of claim 4, wherein the suction pipe comprises an inlet portion through which the gas from around the polished base member is drawn into to the suction pipe, and a cross-sectional area of the inlet portion of the suction pipe is greater than a total planar area of the surface of the base member.

7. The method of claim 4, wherein the polishing material comprises a liquid, and the suction pipe drawing the gas from around the polished base member into the suction pipe to provide the pressure at the polished surface which is different from the atmospheric pressure, maintains the liquid in the polishing material on the polished surface at a level equal to or greater than about 90% of a total weight of the polishing material on the polished surface.

8. The method of claim 7, wherein the polishing material comprises deionized water, a surfactant, and slurry.

9. A method of manufacturing a display apparatus, the method comprising:

providing a polishing material on a base member of the display apparatus which is unpolished, a pressure at the surface of the base member which is unpolished defining an atmospheric pressure, polishing a surface of the base member which is unpolished with the polishing material to provide a polished base member having the polishing material on a polished surface, providing a pressure at the polished surface of the polished base member which is different from the atmospheric pressure, wherein the providing the pressure comprises providing a suction pipe of a manufacturing apparatus facing the polished surface of the polished base member having the polishing material thereon and drawing a gas from around the polished base member into the suction pipe to provide the pressure at the polished surface which is different from the atmospheric pressure, and wherein the polishing the surface of the base member is performed at a polisher of the manufacturing apparatus which precedes the suction pipe along the manufacturing apparatus, further comprising transferring the polished base member to an area outside the manufacturing apparatus which follows the suction pipe and includes the atmospheric pressure.

10. A method of manufacturing a display apparatus, the method comprising:

at a polisher of a manufacturing apparatus, supplying a polishing material to a base member of the display apparatus and polishing the base member by using the polishing material, the polishing the base member providing a polished base member having the polishing material thereon;

transferring the polished base member from the polisher to a conveyer of the manufacturing apparatus which follows the polisher along the manufacturing apparatus; and drawing a gas from around the polished base member which is at the polisher and the conveyer, into a suction pipe of the manufacturing apparatus which faces each of the polisher and the conveyer, to maintain the polishing material on the polished base member which is at the polisher and the conveyer.

* * * * *